US006825913B1

(12) United States Patent
Schuster et al.

(10) Patent No.: US 6,825,913 B1
(45) Date of Patent: Nov. 30, 2004

(54) RETICLE WITH CRYSTAL SUPPORT MATERIAL AND PELLICLE

(75) Inventors: Karl-Heinz Schuster, Königsbronn (DE); Christian Wagner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 09/261,080

(22) Filed: Mar. 2, 1999

(30) Foreign Application Priority Data

Feb. 3, 1998 (DE) .......................... 198 08 461

(51) Int. Cl.[7] .................. G03B 27/52; G03B 27/62; G03F 9/00
(52) U.S. Cl. .................. 355/30; 355/75; 430/5
(58) Field of Search .................. 355/30, 53, 72, 355/75; 428/14, 194; 430/5, 321, 322, 323, 324

(56) References Cited

U.S. PATENT DOCUMENTS

| | | | |
|---|---|---|---|
| 4,604,292 A | | 8/1986 | Evans et al. |
| 4,735,877 A | * | 4/1988 | Kato et al. .................. 430/5 |
| 5,085,899 A | * | 2/1992 | Nakagawa et al. .......... 428/14 |
| 5,088,006 A | | 2/1992 | Del Puerto et al. |
| 5,147,742 A | | 9/1992 | Ban et al. |
| 5,168,001 A | * | 12/1992 | Legare et al. .............. 428/194 |
| 5,370,951 A | * | 12/1994 | Kubota et al. ............... 430/5 |
| 5,436,761 A | * | 7/1995 | Kamon ....................... 359/487 |
| 5,536,604 A | * | 7/1996 | Ito ............................. 430/5 |
| 5,590,148 A | * | 12/1996 | Szarmes ..................... 372/105 |
| 5,601,955 A | * | 2/1997 | Fujita et al. ................ 430/5 |
| 5,677,755 A | * | 10/1997 | Oshida et al. .............. 355/53 |
| 5,693,382 A | * | 12/1997 | Hamada et al. ............ 428/14 |
| 5,866,280 A | * | 2/1999 | Ito et al. .................... 430/5 |
| 5,935,733 A | * | 8/1999 | Scott et al. ................. 430/5 |
| 6,150,060 A | * | 11/2000 | Vernon ....................... 430/5 |
| 6,153,877 A | * | 11/2000 | Ashida ....................... 250/216 |
| 6,197,454 B1 | * | 3/2001 | Yan .............................. 430/5 |
| 6,200,711 B1 | * | 3/2001 | Kurihara et al. ............ 430/5 |

FOREIGN PATENT DOCUMENTS

GB        2 139 781 A    11/1984    ............ G03F/1/00

OTHER PUBLICATIONS

U.S. patent application Ser. No. 08/717,902, filed Sep. 23, 1996.
XP–002164405 JP50023595 B XP–002164406 JP7142334 A.
European Search Report dated Jul. 9, 2001.

* cited by examiner

*Primary Examiner*—Rodney Fuller

(57) ABSTRACT

An illumination equipment for microlithography has an illumination system, and a reticle with magnesium fluoride as the support material. The illumination system provides radially polarized light, and the magnesium fluoride is oriented with its principal axis about in the direction of the optical axis (A) at the reticle. In addition, a suitable cooling system is described.

6 Claims, 1 Drawing Sheet

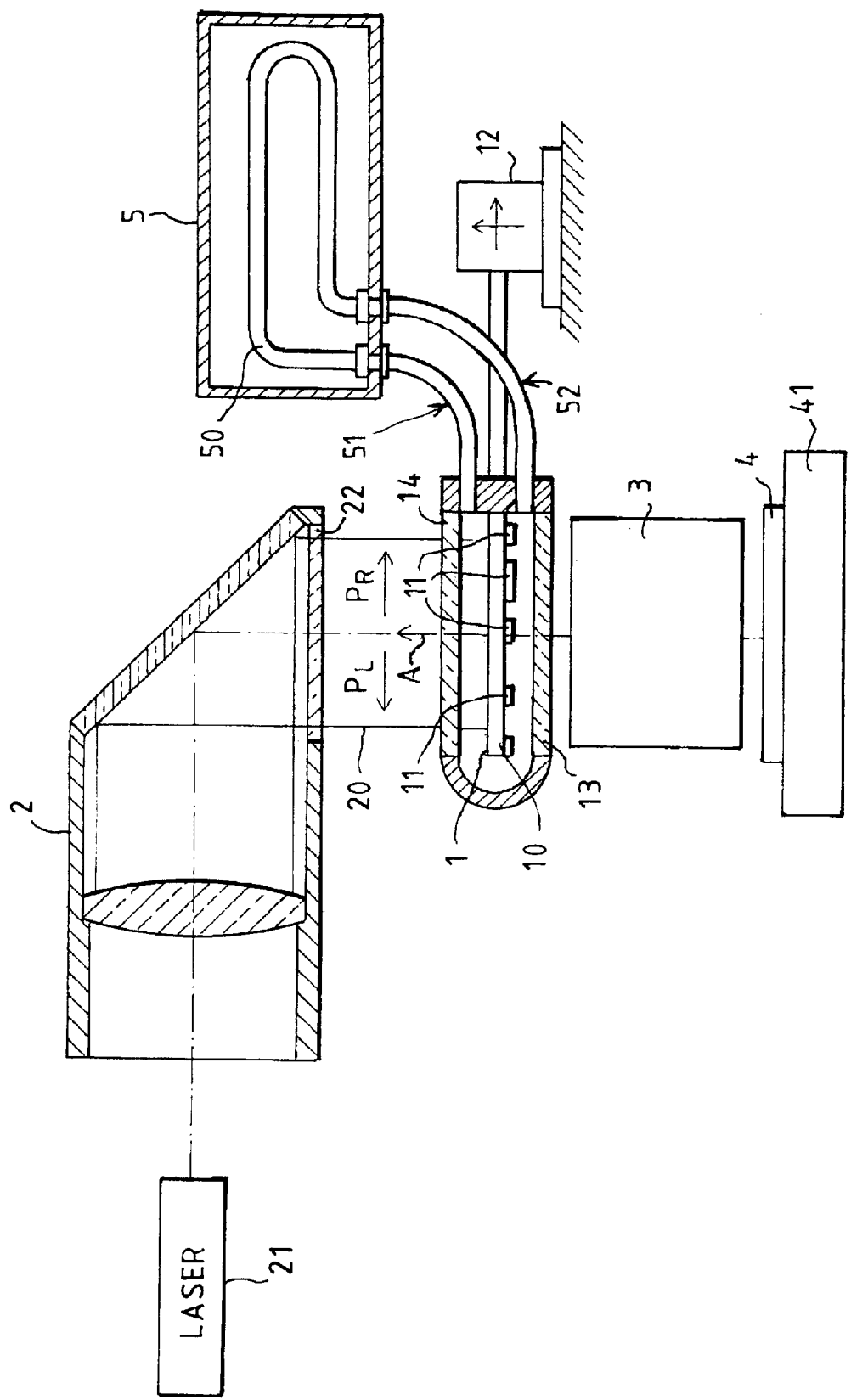

RETICLE WITH CRYSTAL SUPPORT MATERIAL AND PELLICLE

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The invention relates to a reticle whose transparent support material consists of an optically uniaxial crystal.

2. Discussion of Relevant Art

A reticle for 100–200 nm lithography whose substrate is to consist of $MgF_2$, or equally well of $CaF_2$ or diverse other fluorides, is described in German Patent DE 34 17 888 A (British Patent document 21 39 781). Manifestly only their transparency in the given wavelength region is considered as the selection criterion. Nothing is said concerning the crystal structure, birefringence, thermal expansion, and polarization.

In the Technical Publication TP 58401,157 nm lithography with transparent optical elements, of $MgF_2$ among others, is described without being specified in more detail.

$MgF_2$ is a typical optically uniaxial crystal.

A radially polarization-rotating optical arrangement, and a microlithography projection illumination equipment therewith, is described in German Patent DE 195 35 392 A.

Lithography with the excimer laser wavelength of 157 nm can no longer fall back on the proven quartz glass as reticle support material, since quartz glass is opaque in the given spectral region. Isotropic $CaF_2$ has a drastically higher linear thermal expansion coefficient of $18.9 \cdot 10^{-6}/°K$, as against $0.5 \cdot 10^{-6}/°K$ for quartz glass.

The already proposed $MgF_2$ (magnesium fluoride) has a markedly smaller thermal expansion. Based on the crystal structure, however, not only is this crystal optically uniaxially birefringent, but also the thermal expansion is anisotropic.

Pellicles are thin diaphragms for the protection of the mask structure on the reticle. Besides organic foils, $SiO_2$ pellicles are also known. Japanese Laid-Open Patent Publication JP-A-481756 describes a pellicle in which a fluoropolymer is coated on both sides with $CaF_2$.

SUMMARY OF THE INVENTION

The invention has as its object to provide a reticle, which is suitable for wavelengths in the 100–200 nm region and which is improved as regards its thermal and optical properties. The same holds for a pellicle according to the invention.

The object is attained by a reticle according to the invention with support material of transparent, optically uniaxial crystal, in which the principal axis (A) of the crystal is substantially perpendicular to the surface of the reticle. Advantageously, the support material is $MgF_2$ According to the invention, the axial direction of the crystalline support is oriented such that the thermal expansion within the reticle surface is homogeneous. Ideally, this is obtained with an exactly perpendicular orientation of the crystal axis. However, deviations arising from manufacturing technology, for example, can be tolerated to the extent that the resulting increasingly unequal thermal expansion can be tolerated. The tolerance of 5° represents a measure above which the embodiment would be little appropriate.

$MgF_2$ is the preferred optically uniaxial crystal.

The disturbance of the microlithographic imaging by thermal expansion can be additionally reduced by means of a cooling device according to an advantageous feature of the invention.

An optimization of the optical properties also results according to an advantageous feature of the invention from bonding the thus constituted reticle into an illumination equipment that provides radially polarized light. The refraction at the crystal is thereby no longer dependent on direction. For the tolerance against deviations of the optical axis from the crystal axis, the above-mentioned correspondingly holds, and hence it is advantageous to include in such illumination equipment the features described above.

An illuminating device is thus provided with a reticle that is transparent at light wavelengths of 100–200 nm, in which anisotropies of thermal expansion and of refraction play no part, and the absolute amount of the thermal expansion is halved in contrast to $CaF_2$ ($9.4 \cdot 10^{-6}/°K$) as the most prevalent comparison material.

A further advantageous embodiment of the reticle according to the invention is provided by suitable cooling.

The constitution of a pellicle according to the invention consists of a fluoride crystal, preferably $CaF_2$, or $BaF_2$ or $MgF_2$.

BRIEF DESCRIPTION OF THE DRAWING

The invention will be described in more detail with reference to the example shown in the accompanying drawing, in which FIG. 1 shows, schematically, a projection illumination equipment of the kind according to the invention.

DETAILED DESCRIPTION OF PREFERRED EMBODIMENTS

A DUV excimer laser 21 with e.g. 157 nm wavelength forms, with an optics 2, an illumination system which is supplemented with a radial polarizer 22 according to German Patent document DE 195 35 392 A. A light pencil 20, with radial polarization as indicated by the vectors PL and PR and the optical axis A, is thus produced.

The light pencil 20 passes through a reticle 1 with non-transmitting structures 11, e.g. of chromium, on the transparent support 10. This is formed of $MgF_2$ here, with an orientation of the main axis in the direction of the optical axis A. The structures 11 are then imaged through the projection objective 3, e.g., a mirror objective, onto the wafer 4, which is positioned on a carrier device 41. The structures 11 are arranged on the side of the support 10 remote from the projection objective 3, since the support material 10 is then not arranged in the imaging path proper. The reticle 1 is fastened in a positioning device 12.

The reticle 1 is arranged between two plane parallel cover plates (pellicles) 13, 14 of material of suitable transparency, e.g., $CaF_2$, $BaF_2$, or of $MgF_2$ having the same orientation, which are connected to a duct system 51, 52 and a cooling system 5. The reticle 1 can thereby be flushed with a fluid 50, preferably a gas, and indeed most suitably helium There is thus made possible an effective temperature equalization between regions of the reticle 1 that are differently endowed with structure 11, or are irradiated with different intensity by the light pencil 20, and also an overall cooling and temperature stabilization. Preferably a countercurrent cooling of the front and back side of the reticle 1 is used, as in the example.

The pellicles 13, 14 of fluoride crystal are also advantageous in combination with reticles of other material, with or without fluid cooling.

Production preferably proceeds from 111-oriented crystal plates, which are polished conventionally and/or with an ion beam.

The reticle according to the invention, the pellicle and the system are also suitable for a contact illumination equipment.

The reticle according to the invention can also be used without the radial polarization of the illumination light pencil. If circular polarization of the light is introduced, all the effects of the birefringence are rotationally symmetrical with respect to the optical axis A, and are therefore tolerable in many ways.

We claim:

1. An illumination equipment for microlithography comprising:
    an illumination system, and
    a reticle with magnesium fluoride as support material,
    in which said illumination system provides radially polarized light and said magnesium fluoride is oriented with its crystal principal axis substantially in the direction of the optical axis at said reticle.

2. An illumination equipment for microlithography comprising:
    an illumination system,
    a reticle with support material of transparent optically uniaxial crystal,
    in which said illumination system provides radially polarized light and said support material is oriented with its principal axis substantially in the direction of the optical axis at said reticle.

3. The illumination equipment according to claim 1 or 2 with a cooling device with a flowing fluid.

4. A pellicle in a microlithographic reticle arrangement consisting of fluoride crystal.

5. The pellicle according to claim 4, comprising a fluoride selected from the group consisting of $CaF_2$, $BaF_2$, or $MgF_2$.

6. An illumination equipment for microlithography comprising:
    an illumination system,
    a reticle with support material of transparent optically uniaxial crystal,
    wherein said illumination system provides radially polarized light and said support material is oriented with its principal axis substantially in the direction of said optical axis at said reticle,
    further comprising at least one flat plate arranged parallel at said reticle, in which a fluid flows between said reticle and said at least one flat plate.

* * * * *